（12） United States Patent
Hoffmann

(10) Patent No.: US 7,894,290 B2
(45) Date of Patent: Feb. 22, 2011

(54) METHOD AND APPARATUS FOR PERFORMING INTERNAL HIDDEN REFRESHES WHILE LATCHING READ/WRITE COMMANDS, ADDRESS AND DATA INFORMATION FOR LATER OPERATION

(75) Inventor: Jochen Hoffmann, Colchester, VT (US)

(73) Assignee: Qimonda AG, Munich (DE)

( * ) Notice: Subject to any disclaimer, the term of this patent is extended or adjusted under 35 U.S.C. 154(b) by 122 days.

(21) Appl. No.: 12/255,755

(22) Filed: Oct. 22, 2008

(65) Prior Publication Data

US 2010/0097874 A1 Apr. 22, 2010

(51) Int. Cl.
*G11C 7/00* (2006.01)
(52) U.S. Cl. ..................................... 365/222
(58) Field of Classification Search ................. 365/194, 365/222, 230.08
See application file for complete search history.

(56) References Cited

U.S. PATENT DOCUMENTS

| | | | | |
|---|---|---|---|---|
| 6,643,732 | B1 * | 11/2003 | Shih ............................ | 711/106 |
| 6,847,570 | B2 * | 1/2005 | Fujioka et al. .............. | 365/222 |
| 7,002,875 | B2 * | 2/2006 | Ikeda .......................... | 365/222 |
| 7,203,113 | B2 * | 4/2007 | Takahashi et al. ........... | 365/222 |
| 7,362,639 | B2 * | 4/2008 | Takahashi .................... | 365/222 |

* cited by examiner

*Primary Examiner*—VanThu Nguyen
(74) *Attorney, Agent, or Firm*—Patterson & Sheridan, LLP

(57) ABSTRACT

A method of operating a system including a memory device. The method includes, upon receiving a request for an internal hidden refresh for the memory device, latching external command, address, and data information for the memory device. The method further includes placing the memory device in a standby state and during the standby state, performing the internal hidden refresh. The method further includes, after performing the internal hidden refresh, placing the memory device in a state corresponding to the latched external command, address, and data information for the memory device.

33 Claims, 12 Drawing Sheets

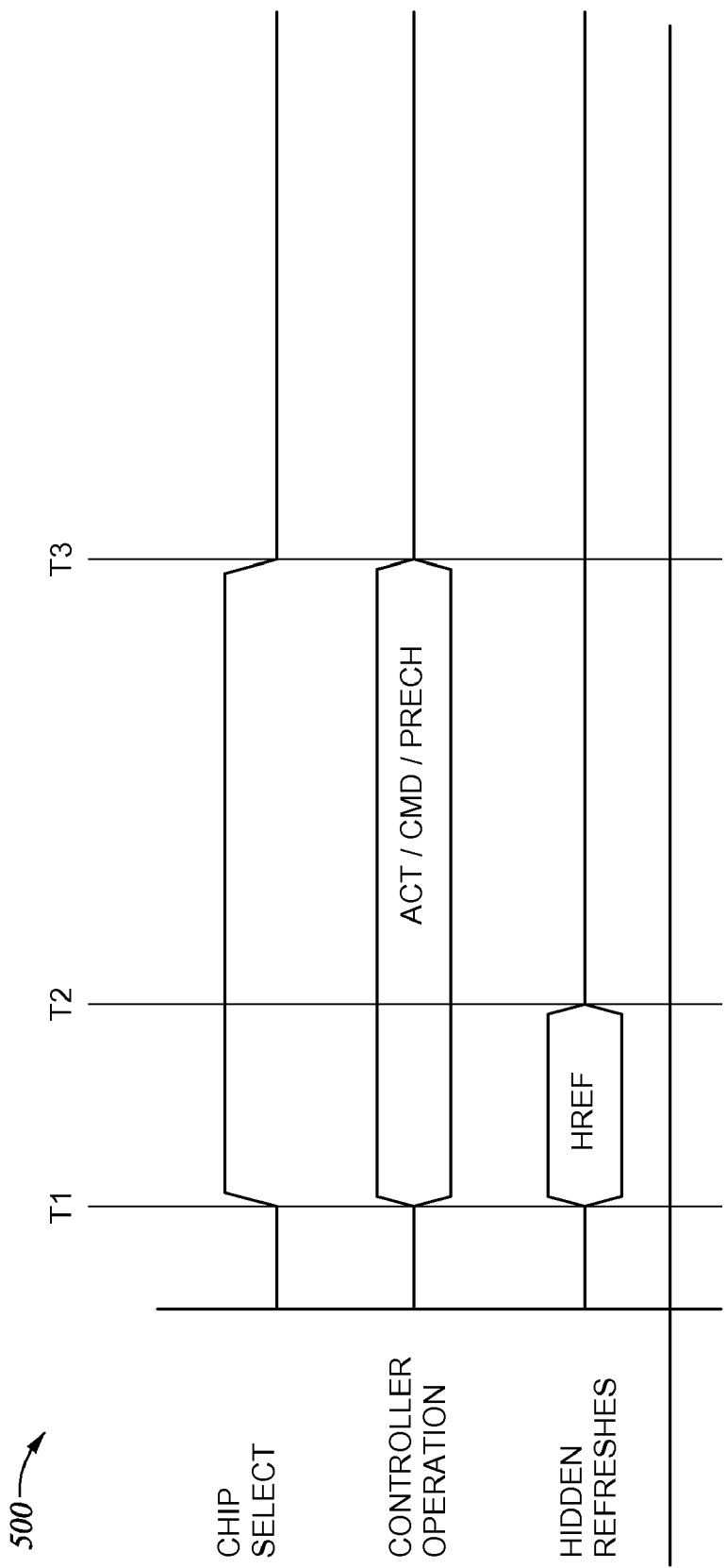

METHOD AND APPARATUS FOR PERFORMING INTERNAL HIDDEN REFRESHES WHILE LATCHING READ/WRITE COMMANDS, ADDRESS AND DATA INFORMATION FOR LATER OPERATION

BACKGROUND OF THE INVENTION

The invention generally relates to memory devices, and more specifically to internally-refreshing dynamic random access memory (DRAM).

Many modern electronic devices contain digital memory (e.g., a dynamic random access memory, DRAM). Each memory may be used to store information for a digital device. Users of such electronic devices typically desire a fully functional device that is as inexpensive as possible. To that end, there is a push to replace more expensive Flash memory and static random access memory (SRAM) with less expensive DRAM memory.

DRAM devices store data in memory elements that have an associated retention time. DRAM devices are referred to as dynamic because if the memory elements are not refreshed within the retention time, the data stored in the memory element may be lost. For example, a DRAM usually stores data in capacitors which, due to leakage, gradually discharge and need to be periodically refreshed in order to prevent data loss. Accordingly, the memory elements are periodically refreshed.

During typical DRAM operating conditions, a memory controller connected with a DRAM device generates periodic signals to refresh the memory elements in order to retain the data. However, when DRAM is used in a system to emulate other types of memory, such as Flash and SRAM, the system's memory controller may not be configured for DRAM operation, and thus may be unable to generate the periodic refresh signals.

Accordingly, what is needed is a method and apparatus for refreshing a DRAM device.

SUMMARY OF THE INVENTION

Embodiments of the invention generally provide a method of operating a system including a memory device. The method includes, upon receiving a request for an internal hidden refresh for the memory device, latching an external command, address, and data information for the memory device. The method further includes placing the memory device in a standby state and during the standby state, performing the internal hidden refresh. The method further includes, after performing the internal hidden refresh, placing the memory device in a state corresponding to the latched external command, address, and data information for the memory device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5 is a timing diagram depicting the timing of the dynamic memory device during normal operation, according to one embodiment of the invention;

DETAILED DESCRIPTION OF THE PREFERRED EMBODIMENT

Figure 1:
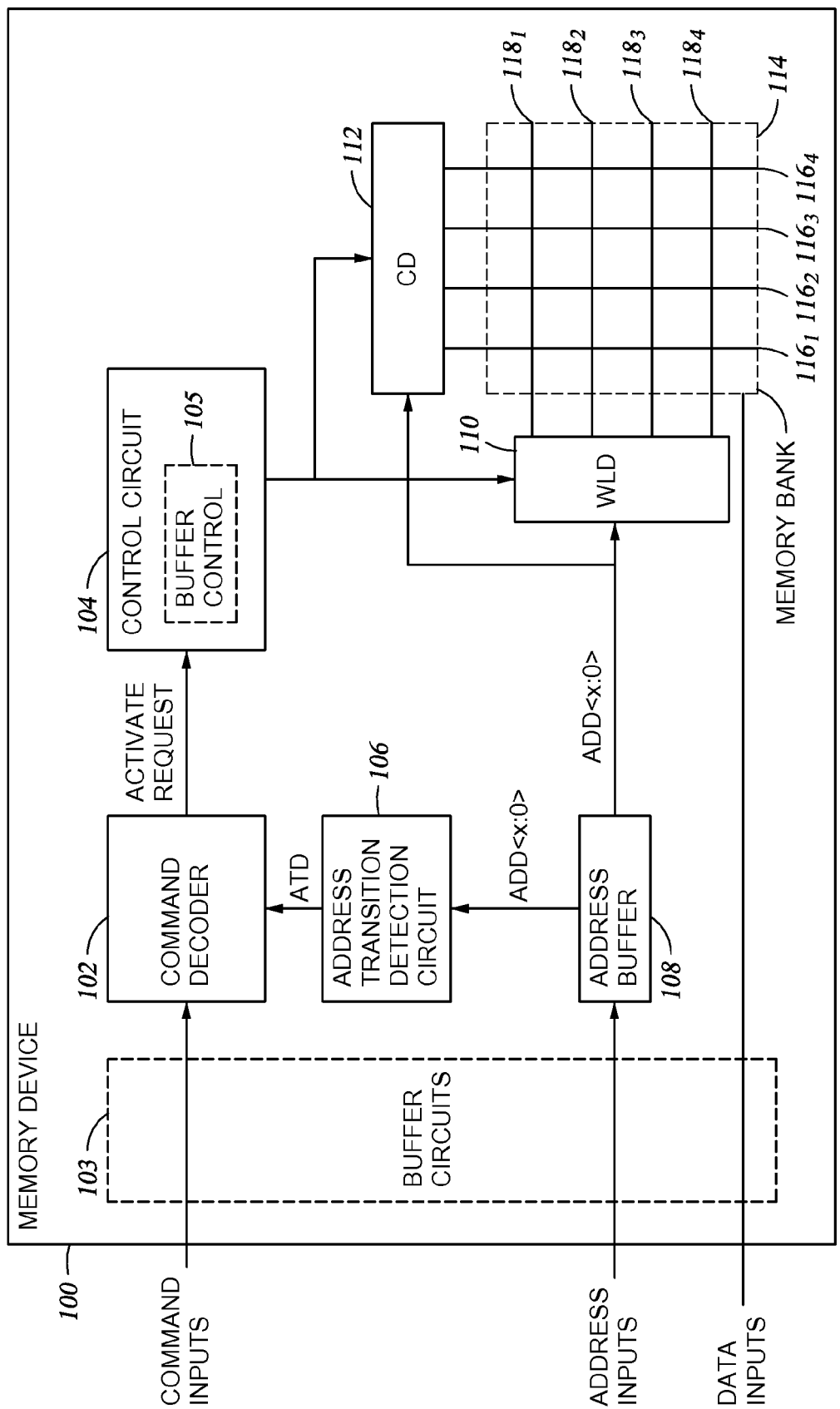
FIG. 1 is a block diagram depicting a dynamic memory device, according to one embodiment.

Embodiments of the invention generally provide a method of operating a system including a memory device. The method includes, upon receiving a request for an internal hidden refresh for the memory device, latching an external command, address, and data information for the memory device. The method further includes placing the memory device in a standby state and during the standby state, performing the internal hidden refresh. The method further includes, after performing the internal hidden refresh, placing the memory device in a state corresponding to the latched external command, address, and data information for the memory device. By latching the external command, address, and data information, the state of the memory device may be saved while the internal hidden refresh is performed. After the refresh is performed, the state of the memory device may be restored, allowing external commands including read and write commands to be interrupted by an internal hidden refresh and then resumed after the hidden refresh has been performed.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Also, signal names used below are exemplary names, indicative of signals used to perform various functions in a given memory device. In some cases, the relative signals may vary from device to device. Furthermore, the circuits and devices described below and depicted in the figures are merely exemplary of embodiments of the invention. As recognized by those of ordinary skill in the art, embodiments of the invention may be utilized with any memory device performing internal refresh-cycles, including memory devices not yet contemplated.

In some cases, embodiments of the invention may be used with multiple types of memory or with a memory which is included on a device with multiple other types of memory. Thus, an embodiment may include at least one volatile memory chip/device that performs internal refresh-cycles and one or more other types of memory chips/devices. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (FeRAM), phase-change RAM (PRAM), electrically erasable programmable read-only memory (EEPROM), laser programmable fuses, electrically programmable fuses (e-fuses), and any other types of nonvolatile memory.

In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

FIG. 1 is a block diagram depicting a dynamic memory device 100 according to one embodiment of the invention. The dynamic memory device 100 may include address inputs, command inputs, and data inputs. The address inputs may be received by an address buffer 108 and the command inputs may be received by a command decoder 102. The address inputs may be used by a wordline decoder 110 and column decoder 112 to access memory cells in a memory bank 114. In some cases, multiple memory banks 114 may be accessed using a single wordline decoder 110 and column decoder 112. The memory bank may or may not be individually selectable (e.g., via a bank select (BNKSEL) signal) relative to other banks/arrays. Thus, as used herein, memory "bank" is synonymous with memory "array".

In one embodiment, the column decoder 112 may select bitlines 116 of the memory bank 114 to be accessed. Similarly, the wordline decoder 110 may select wordlines 118 to be accessed. In some cases, access may occur based on an address received by the dynamic memory device 100 from an external source. Optionally, the access may occur based on an address which is internally generated. Other circuitry such as sense amps, output buffers, data strobe circuits, etc. (not depicted) may also be used to access and output data from the memory bank 114.

The command decoder 102 may process the command inputs as well as an address transition detection signal from an address transition detection circuit 106 to determine an appropriate operation when activate request signals are received from an external device (e.g., a processor or memory controller that accesses the memory device 100). The activate request signals from the external device indicate a request from the external device for activation of a row of information within the memory bank 114 of the memory device 100 (e.g., an activation command, ACT). In one embodiment, the activate request signals from the command decoder 102 may be sent to a control circuit 104. In general, the control circuit 104 is configured to issue a plurality of control signals, such as column address select (CAS), bank select (BNKSEL), etc.

Figure 2:
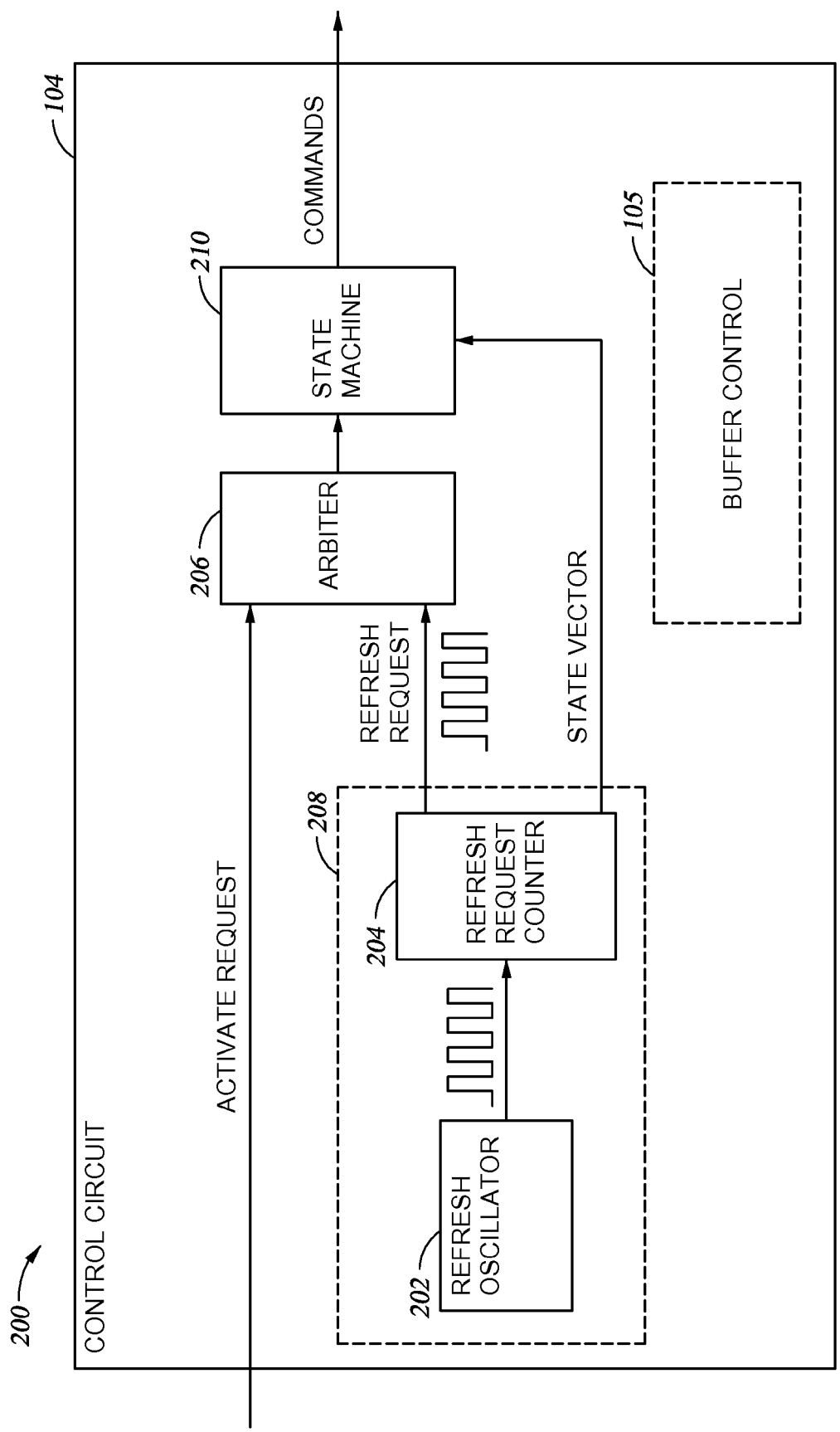
FIG. 2 is a block diagram depicting elements of a control circuit, according to one embodiment.

FIG. 2 illustrates a more detailed view of the control circuit 104, according to one embodiment. In one embodiment, the control circuit 104 includes an arbiter 206 configured to receive the activate request signals from the command decoder 102. As described above, dynamic memory must be frequently refreshed to avoid data loss. Accordingly, the control circuit 104 may also include a refreshing circuit 208 for refreshing dynamic memory, such as DRAM. The refreshing circuit 208 may include a refresh oscillator 202 which may generate a clock signal for a refresh request counter 204. Periodically, depending on a memory state as determined by a state machine 210, the refresh request counter 204 may generate and issue a refresh request to the arbiter 206. Alternatively, the refresh request counter 204 may generate and store the refresh request until the state machine 210 indicates that external access to the dynamic memory device 100 has ceased. This may prevent loss of data in the memory bank 114 during a refresh operation which occurs during processing of an execution resulting from the activate request signals. When the execution completes, the refresh request counter 204 may then issue the stored refresh request and thus the memory bank 114 may be refreshed.

As described above, the arbiter 206 may receive the refresh request from the refresh request counter 204 as well as the activate request signals from the command decoder 102. The arbiter 206 may control access to the memory bank 114 so that only the activate request or the refresh request signals may pass through the arbiter 206 at a given time.

Because of its ability to internally refresh, dynamic memory device 100 may function properly as memory in a system not configured for dynamic memory. For example, in one embodiment, the memory device 100 may provide a static random access memory (SRAM) interface while utilizing a dynamic random access memory (DRAM) array. Typically, the memory in SRAM devices does not require refresh operations. However, where an SRAM interface is provided for a DRAM array, hidden, internal refreshes may be utilized to hide the refreshes from an external device (e.g., a memory controller or processor) which accesses the memory device 100 via the SRAM interface. Thus, embodiments of the invention allow a DRAM device with an SRAM interface to be utilized in an asynchronous manner.

In one embodiment, due to the volatile nature of the dynamic memory device 100, and the potentially asynchronous nature of a system not designed for dynamic memory, there may be certain timing constraints this system must adhere to, including the duration of execution of each access to the memory bank 114. If the memory bank 114 is not refreshed within a specified amount of time, $t_{dyn}$, the storage elements in the dynamic memory may lose stored data. Accordingly, traditional dynamic memory, and even the self-refreshing dynamic memory described above, may not function properly in low-frequency operation, where the duration of external access to the dynamic memory module 100 may exceed $t_{dyn}$.

For example, in dynamic memory where $t_{dyn}$ is 80 μs, and the refresh request counter 204 generates refresh requests every 40 μs, a potential error causing scenario may arise when 25 μs after a memory refresh, an external access to the memory bank 114 begins which lasts 60 μs. In this case, the refresh request counter 204 will generate a refresh request 15 μs after the access to the memory bank 114 began, and the refresh request will be stored in the refresh request counter 204. When the access completes 45 μs later, the refresh request counter 204 may issue the refresh request to arbiter 206. However, at this point 85 μs (25 μs+60 μs) have lapsed since the last memory refresh, which is greater than the $t_{dyn}$, and data in the memory bank 114 may be lost. The timings in this example are meant to be exemplary and are not limiting upon embodiments of the present invention.

To avoid data loss under the circumstances described above, an internal refresh-operation may be executed while the external (controller) access continues. Additional circuitry may be needed to hide the refresh from being visible to the controller and avoid contention if the external access is terminated and/or a new access is started while the hidden refresh is ongoing. One embodiment of the dynamic memory device 100 may include buffer circuitry 103 and buffer control circuitry 105. For purposes of comparison, the dynamic memory device 100 of FIG. 1 was described exclusive of the buffer circuitry 103 and buffer control circuitry 105 (e.g., with the circuitry 103 and 105 disabled). In contrast, FIGS. 3-10 will now be described inclusive of buffer circuitry corresponding control circuitry configured to avoid data loss.

Figure 3:
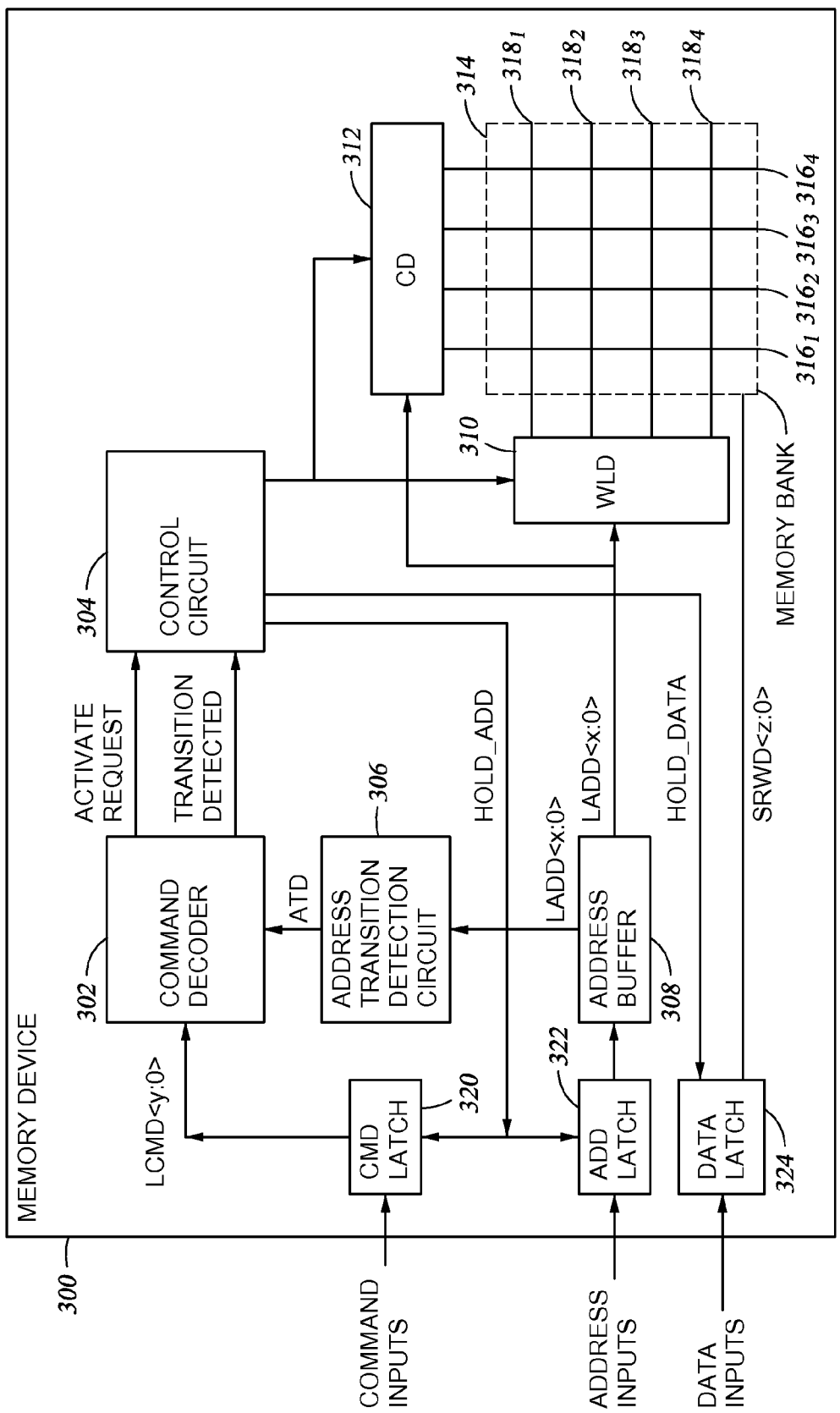
FIG. 3 is a block diagram depicting a dynamic memory device operable during low-frequency memory access, according to one embodiment of the invention.

FIG. 3 is a block diagram depicting a memory device 300, according to one embodiment of the invention. The dynamic memory device 300 is similar to dynamic memory device 100 in that it includes an address buffer 308, a command decoder 302, a word line decoder 310, a column decoder 312, a memory bank 314, and an address transition detection circuit 306. However, the dynamic memory device 300 also includes additional circuitry which may enable operation during low-frequency access of the dynamic memory device 300. Such circuitry corresponds to the buffer circuitry 103 of FIG. 1 and, in one embodiment, includes a plurality of latches. In a particular embodiment, shown in FIG. 3, the buffer circuitry may include command latches 320, address latches 322, and data latches 324.

In one embodiment, the purpose of the latches may be twofold, to store input/output data from the dynamic memory device 300, and to restrict external access to the dynamic memory device 300, according to one embodiment. For example, during a hidden internal refresh, the memory device 300 may be placed in a standby state, interrupting an externally issued command which is being performed. In order to interrupt and later successfully resume the interrupted command, the latches may be used to store the state of the memory device 300 when the command is interrupted. While the memory device is performing the hidden internal refresh command, external access to the memory device 300 may be restricted.

In one embodiment, after the internal hidden refresh has been completed, information in the latches may be used to restore the previous state (e.g., before the standby state and internal refresh) of the memory device 300. After the previous state of the memory device 300 is restored, the memory device 300 may then resume processing external commands. Restoration of the previous state may allow both read and write commands to be interrupted and subsequently resumed while hidden internal refreshes are performed as described below. The interruption may occur during or after a precharge or word line activation. Where the interruption occurs after word line activation, the word line may be deselected during the interruption and reselected after the hidden internal refresh has been performed.

As described below, in some cases, the memory device 300 may be operated in different modes with different sets of timings depending upon the mode. For example, in a regular mode, the memory device 300 may be accessed for relatively short periods of time with respect to another, low frequency mode. In the regular mode, accesses may be performed quickly enough such that a single hidden internal refresh is performed at the beginning of an access without further interrupting the access. In the low frequency mode, the number of internal refreshes performed during an access may depend on the length of the access period.

In one embodiment, the access period is defined by the amount of time for which the memory device 300 is selected by an external device such as a memory controller or processor. For example, the access period may be defined by the amount of time for which the memory device 300 is selected using the chip select signal, an external signal provided by the memory controller or processor accessing the memory device 300. The memory device 300 may measure the length of the access period (and thereby determine the number of refreshes to perform during the access period) using a timer which is initialized at the beginning of the access. Optionally, the length of the access period may be measured by counting the number of internal refresh requests received during an access, for example, as indicated by the refresh request counter 204, described in greater detail below.

In one embodiment, if the access period is short enough, a single hidden internal refresh may be performed. However, if the access is longer, then an additional hidden internal refreshes may be performed, referred to as a must-refreshes. Where a second hidden internal refresh is performed, the access period may be extended to a minimum access period which is longer than the access period in the regular mode, resulting in a second possible timing for the memory device 300 in the low frequency mode. The second timing allows a desired frequency of refreshes to be maintained while simultaneously allowing extended, low frequency accesses to be performed.

In one embodiment, the first refresh-request (or the first n refresh-requests) might be deferred until the external access has completed, and then executed before the next external command is decoded. In another embodiment, if the number of refreshes deferred during any single access exceeds n, one (or m<=n) must-refresh(es) may be executed while the external command is still ongoing.

Figure 4:
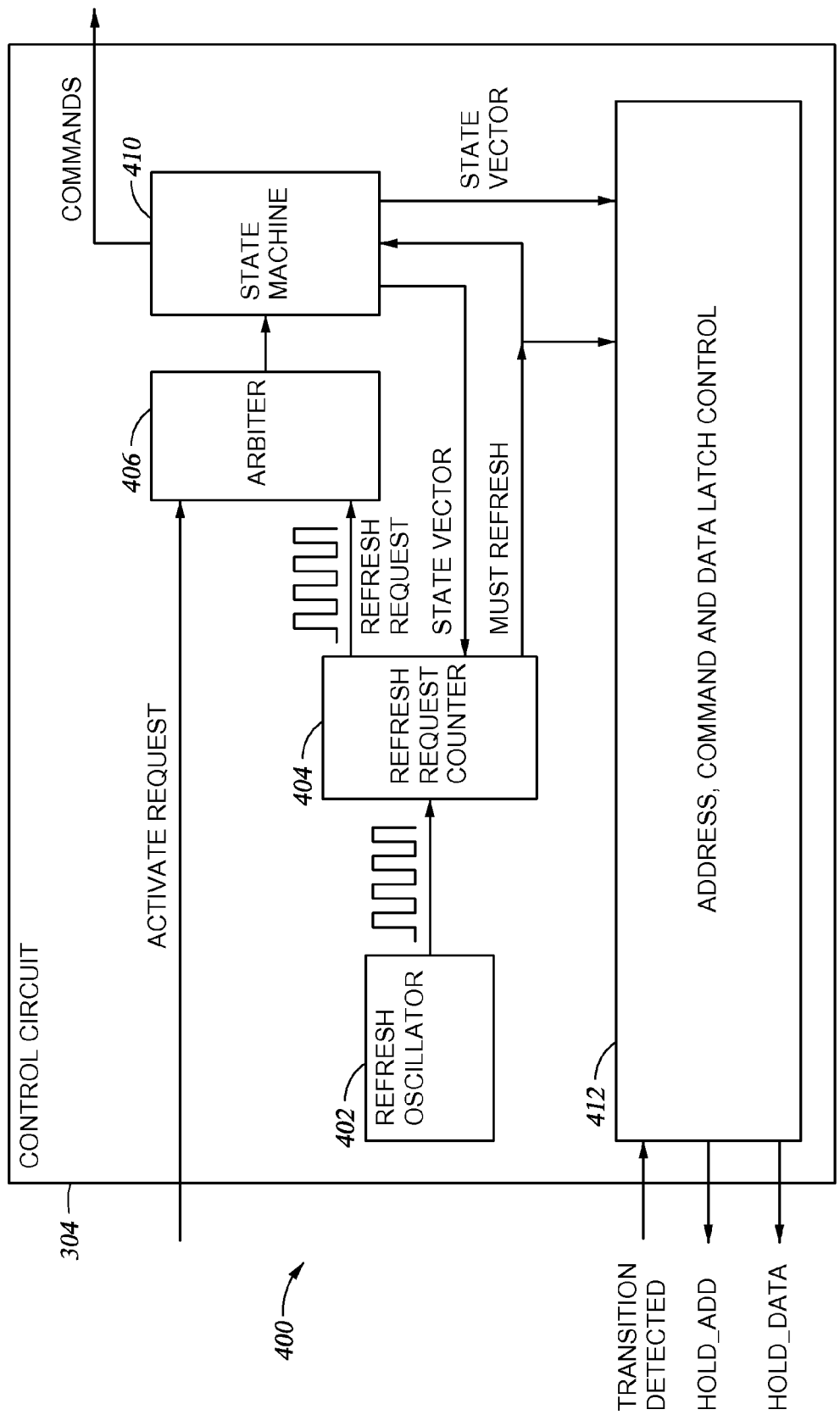
FIG. 4 is a block diagram depicting elements of a control circuit, according to one embodiment of the invention.

In one embodiment, the dynamic memory device 300 may include a control circuit 304 which is used to determine when to perform hidden internal refreshes. One embodiment of the control circuit 304 is shown in FIG. 4. As with dynamic memory device 100, the control circuit 304 may include a refresh oscillator 402, a refresh request counter 404, a state machine 410, and an arbiter 406. Also, to enable low-frequency operation of the dynamic memory device 300, the control circuitry 304 may include an address, command, and data latch control circuit 412 (corresponding to the buffer circuit 105 of FIG. 1). The latch control circuit 412 may control the command latches 320, the address latches 322, and the data latches 324. Additionally, the refresh request counter 404 in the control circuit 304 may be configured to indicate a must-refresh state when a second (or Nth) refresh request is generated while a first (or N−1) refresh request(s) remains stored. Upon detecting the must-refresh state, the latch control circuit 412 may enable the latches 320, 322, 324 to store the current state of data, command, and address lines, and block external access to the dynamic memory device 300, as is described in more detail below.

In one embodiment, when in normal operation, the dynamic memory device 300 may operate in a manner as is depicted in FIG. 5. As depicted, during an access period lasting from time t1 to t3, a hidden internal refresh (HREF) is performed beginning at time t1 and lasting until time t2. After the internal refresh has been performed, then an access command initiated externally (e.g., by a memory controller) may be performed beginning at time t2. Thus, the internal refresh is hidden within the access period t1-t3, thereby allowing the memory device 300 to be refreshed while simultaneously performing externally requested accesses (e.g., read operations and write operations).

Figure 6A:
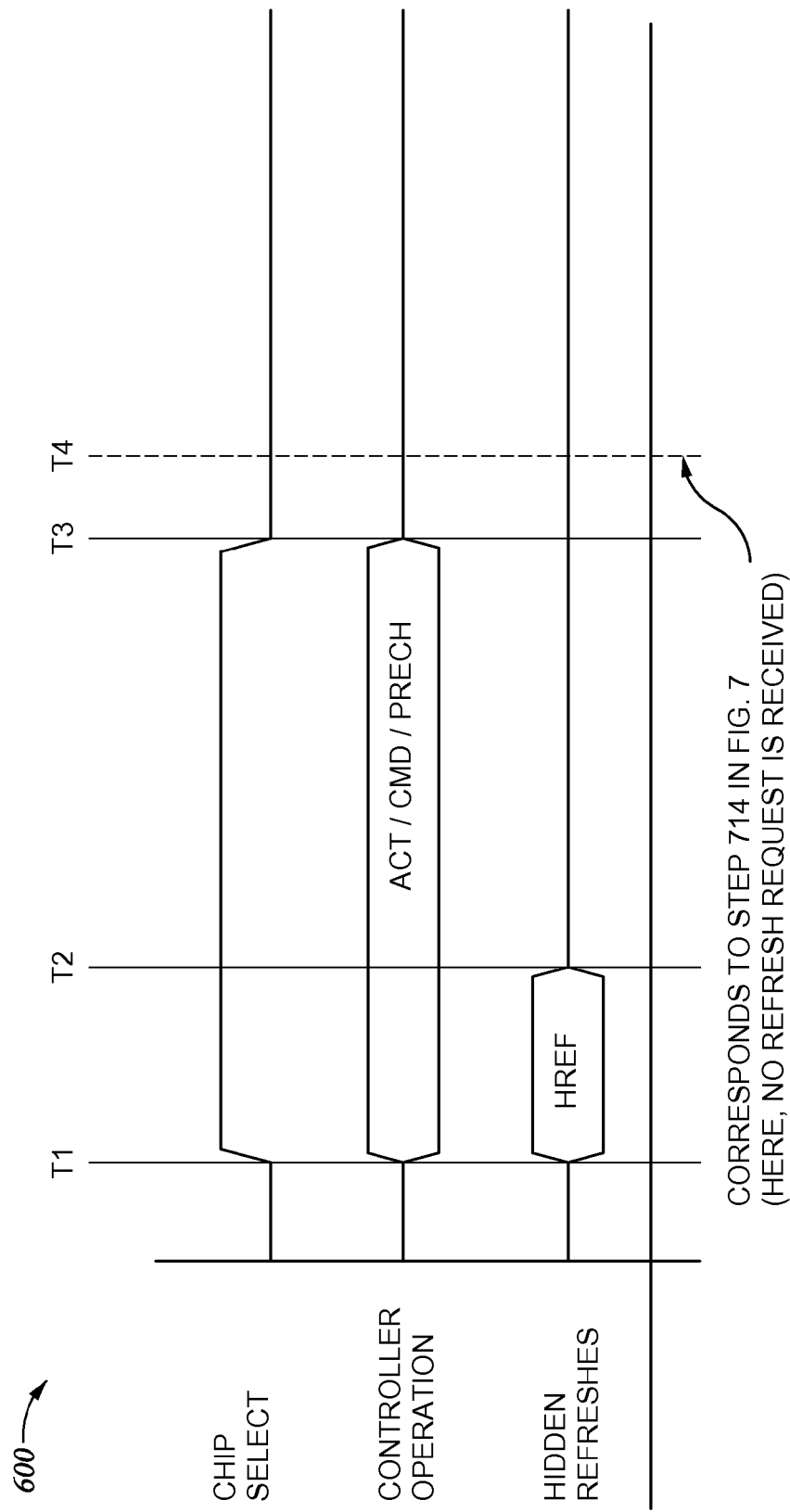
FIGS. 6A-B are timing diagrams depicting the timing of the dynamic memory device during low-frequency mode, according to embodiments of the invention.
Figure 6B:
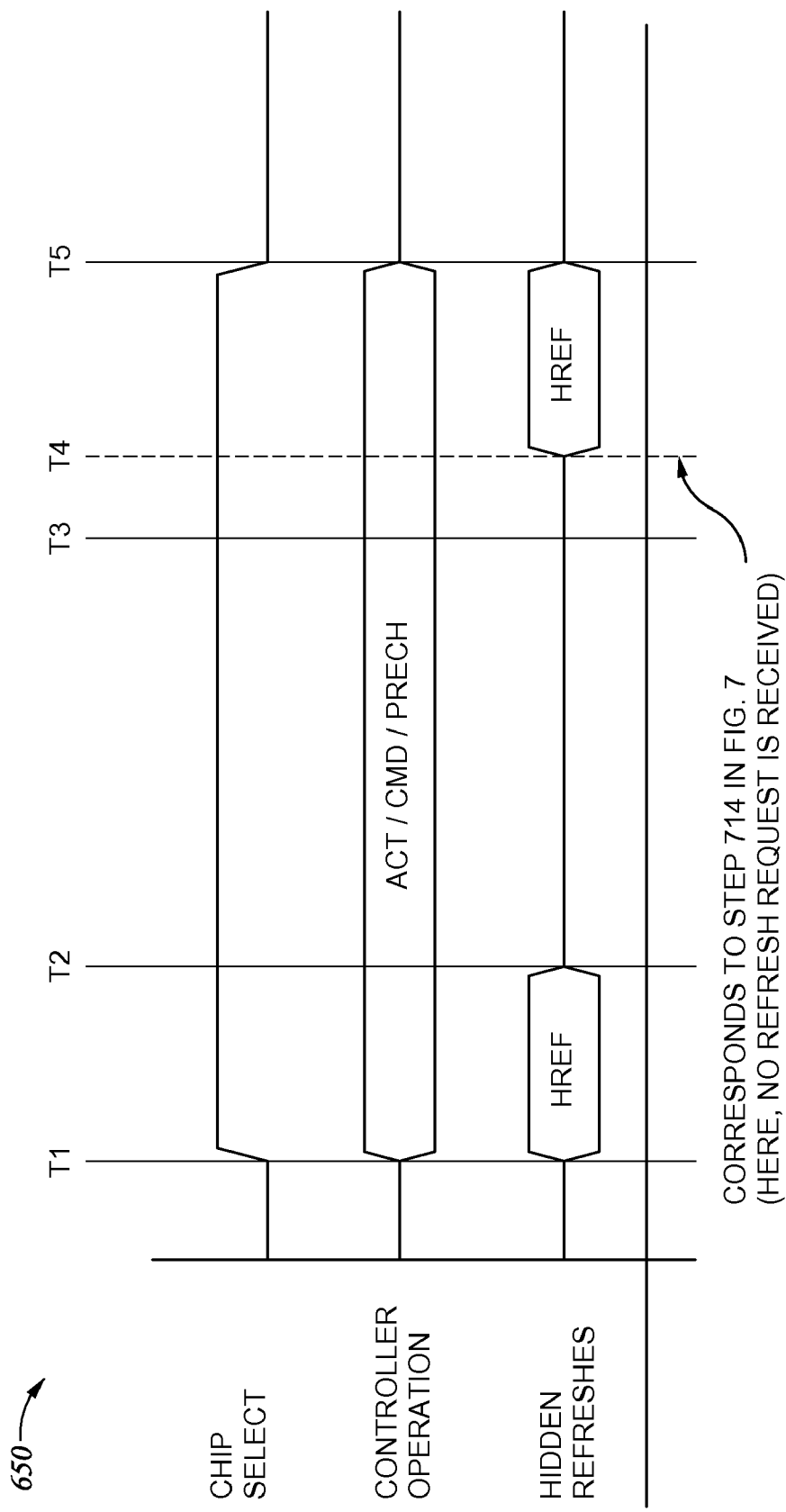

In one embodiment, during low-frequency external access of the dynamic memory device 300, the dynamic memory device 300 may enter a must-refresh state, where the latch control circuit 412 enables the latches 320, 322, 324 to store input/output information and block external access to the dynamic memory device 300. FIGS. 6A-B depict the timing of the dynamic memory device 300 during low-frequency access. As mentioned above, in one embodiment of the invention, the number of internal refreshes performed during a low frequency access may depend on the duration of the access period. For example, when the memory device 300 is placed in low frequency mode, the length of the access period may be less than the internal refresh period. Where the length of the access period (as controlled externally using the chip select signal) is less than the internal refresh period, then only one refresh is performed during an access period. If, however, the length of the access period is greater than the internal refresh period, then two (or more) refreshes may be performed during the access period.

FIG. 6A is a timing diagram 600 depicting a situation in which the access period from times t1 to t3 is less than the internal refresh period from times t1 to t4. As depicted, a single internal refresh is performed at the beginning of the access period from times t1 to t2. The externally initiated access is then completed by time t3.

FIG. 6B is a timing diagram 650 depicting a situation in which the access period from times t1 to t5 is greater than the refresh period from times t1 to t4. As depicted, a first internal refresh is performed from times t1 to t2. The externally initiated access is then performed from times t2 to t5. Because the externally initiated access does not complete within the internal refresh period from times t1 to t4, the access period is extended to time t5, thereby allowing a second internal refresh period to be performed from times t4 to t5. By extending the access period to time t5, the desired number of internal refreshes may be performed by the memory device 300, thereby ensuring that the specified refresh rate for the memory device 300 is maintained while the external access is taking place.

Process for Refreshing Dynamic Memory During Low-Frequency Access

Figure 7:
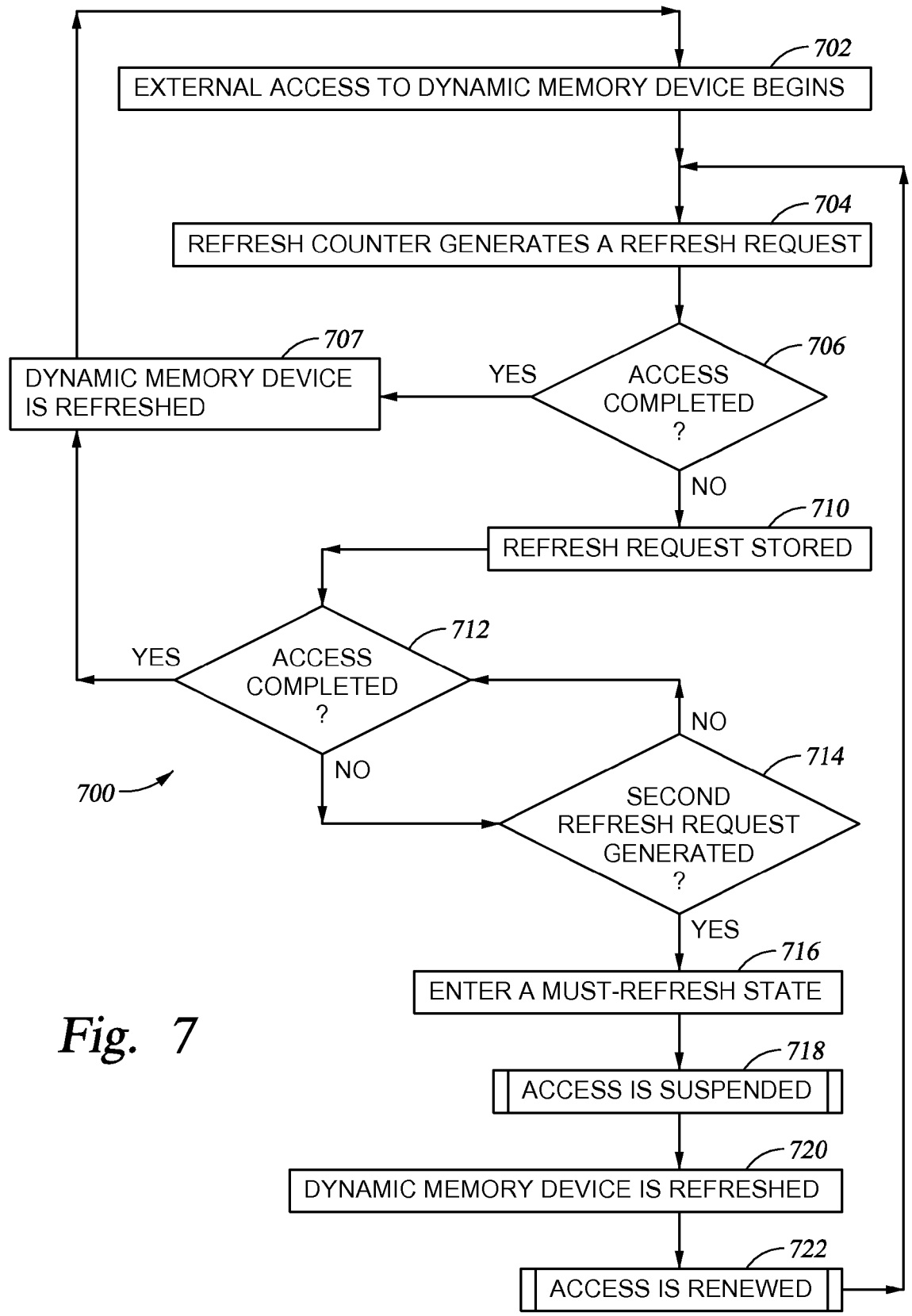
FIG. 7 is a flow chart depicting a process for refreshing dynamic memory during low-frequency access, according to one embodiment of the invention.

FIG. 7 is a flow chart depicting a process 700 for refreshing dynamic memory during low-frequency access, according to one embodiment of the invention. The process begins at step 702, where external access to the dynamic memory device 300 may begin. Some time after access to the dynamic memory device 300 begins, a refresh request counter 404 may generate a first refresh request, as in step 704.

In one embodiment, in step 706, a determination may be made as to whether or not the external access to the dynamic memory device 300 completed prior to the generation of the first refresh request. The determination of whether or not external access to the dynamic memory device 300 has completed may depend on the contents of a state vector generated by a state machine 410. The state vector may contain information about the state of access to the dynamic memory device 300, and specifically the memory bank 314. If the state vector indicates that external access to the dynamic memory device 300 is complete, the refresh request counter 404 may issue the generated first refresh request, and the dynamic memory device 300 may be refreshed, as in step 707. If the state vector indicates that external access to the dynamic memory device 300 is ongoing, the refresh request counter 404 may store the first refresh request, as in step 710. Alternatively, the refresh request counter 404 may issue the first refresh request, and the arbiter 406 may store the request.

In one embodiment, the refresh request counter 404 and/or the arbiter 406 may monitor the state vector to determine if the external access to the dynamic memory device 300 has completed, as in step 712. If the external access has completed, the stored first refresh request may be issued, and the dynamic memory device 300 may be refreshed, as in step 707. Otherwise, if the external access has not completed, the process 700 may proceed to step 714, where a determination may be made as to whether a second refresh request has been generated by the refresh request counter 404.

In one embodiment, if no second refresh request has been generated by the refresh request counter 404, the process 700 may return to step 712. Otherwise, the second refresh request has been generated, and the dynamic memory device 300 may be placed into a must-refresh state, as in step 716. In one embodiment, if the first refresh request is stored in the refresh request counter 404, the refresh request counter 404 may indicate the must-refresh state. Alternatively, if the first refresh request is stored in the arbiter 406, the arbiter 406 may indicate the must-refresh state. In either case, indicating the must-refresh state may be done by issuing a signal, e.g., to the state machine 410 and the latch control 412.

In one embodiment, the ongoing external access to the dynamic memory device 300 may be suspended in step 718, as is described below. Once access has been suspended, data stored within the dynamic memory device 300 may be refreshed, as in step 720. Once the data stored within the dynamic memory device 300 is refreshed, the process 700 may continue to step 722, where external access to the dynamic memory device 300 may be renewed, as is described below. The process may return to step 704, where another refresh request may be generated by the refresh request counter 404.

In an alternative embodiment of the invention, if a single refresh operation is performed in step 720, the method illustrated in FIG. 7 may be modified to go to step 712 (instead of step 704) after the access is renewed in step 722. However, if two refresh operations are performed in step 720 (corresponding to the two refresh requests received), the method may go to step 704 after access is renewed in step 722, as illustrated in FIG. 7.

In one embodiment, each refresh request may correspond to a specific portion of the memory bank 314 to be refreshed. Accordingly, when the must-refresh state is entered, the portion of the memory bank 314 corresponding to the first refresh request may be refreshed before the portion of the memory bank 314 corresponding to the second refresh request. Alternatively, each refresh request may correspond to a burst refresh, where all data stored on the dynamic memory device 300 may be refreshed. Therefore, it may be unnecessary to execute both the first and second refresh request, and the must-refresh state may correspond to a single burst refresh.

In one embodiment, two or more refresh requests may be generated and stored without causing the dynamic memory device 300 to enter the must-refresh state. In this embodiment, the must-refresh state may be triggered by generation of a third or later refresh request. Once in the must-refresh state, all stored refreshes may be issued sequentially. Alternatively, one or more, but not all, stored refresh requests may be issued. In one embodiment, when the number of stored refreshes reaches a certain value, a burst refresh may occur, where all the data stored on the dynamic memory device 300 may be refreshed. As with previous embodiments, the timing of this embodiment must be such that the period between two refreshes of the dynamic memory device 300 never exceeds $t_{dyn}$.

In one embodiment, the dynamic memory device 300 may operate in a manner that allows the use of a full command-set during both normal operation and low-frequency operation. While potentially slowing access to the memory bank 314 during low-frequency operation, an embodiment of the invention may permit the use of the entire set of commands which may include one or more of read, write, page-read, page-write, late-write (or read+modified-write), deselect, no operation, active, and precharge.

Figure 8:
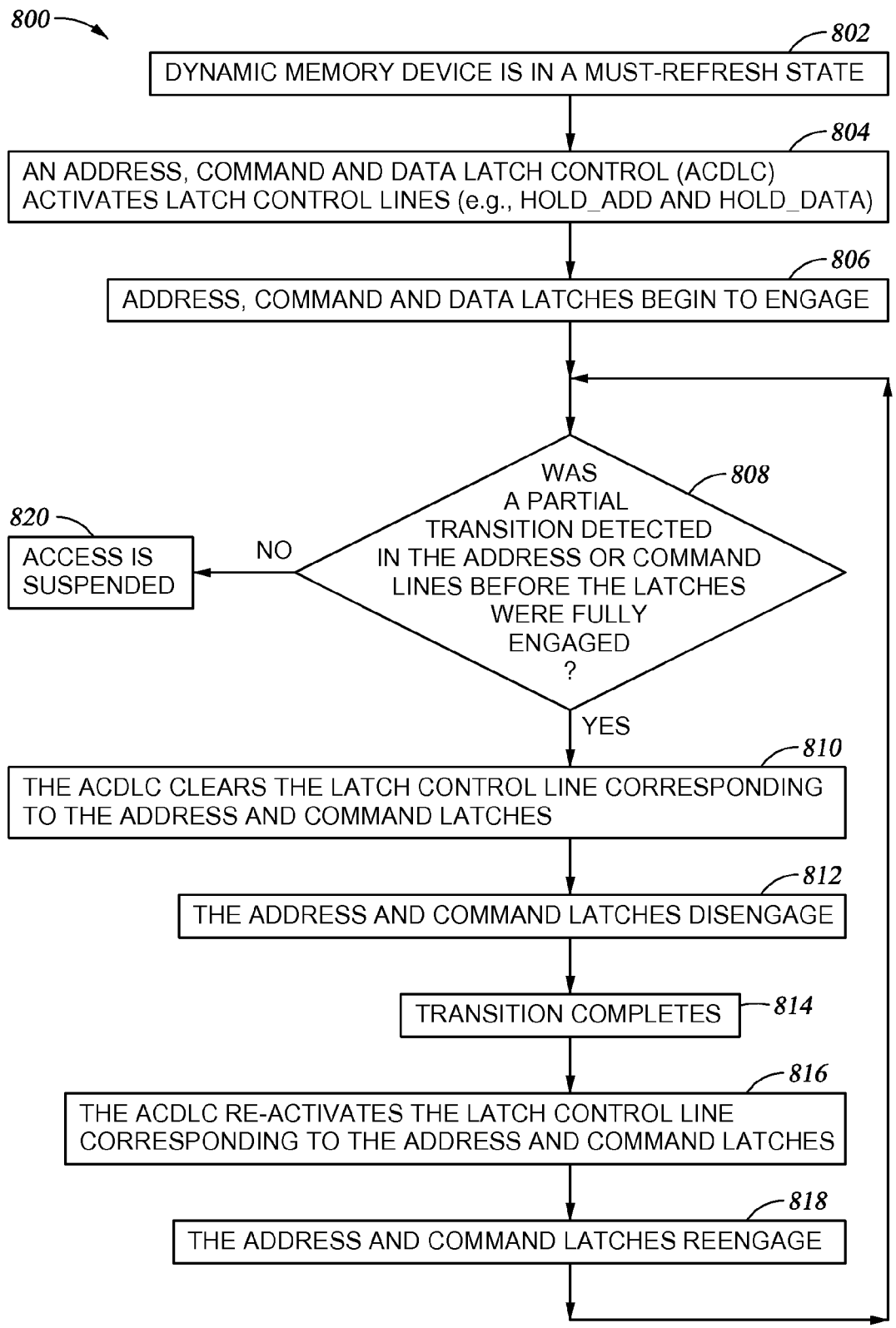
FIG. 8 is a flow chart depicting a process for suspending access to the dynamic memory device, according to one embodiment of the invention.

FIG. 8 is a flow chart depicting a process 800 (corresponding to step 718 of FIG. 7) for suspending access to the memory device, according to one embodiment of the invention. The process 800 may begin at step 802, where the dynamic memory device 300 may be in a must-refresh state. A must-refresh state may be entered when a memory refresh is needed to avoid losing data (based on memory cell retention time), but an external access to the dynamic memory device 300 is not yet complete. For example, the dynamic memory device 300 may be in a must-refresh state when at least two refresh requests have been generated by the refresh request counter 404 without a pause in the external access.

In one embodiment, an address, command, and data latch control circuitry 412 may detect that the dynamic memory device 300 is in the must-refresh state, and may set latch control lines (e.g., HOLD_ADD and HOLD_DATA) to be active, as in step 804. The latch control lines may be connected to command latches 320, address latches 322, and data latches 324 that are communicatively connected to respective command, address, and data lines used to interface the dynamic memory device 300 with one or more external devices.

In one embodiment, the latches 320, 322, 324 respond to the activated latch control lines by latching data present at the inputs of the latches 320, 322, 324 in step 806. There may be a finite response time between when the latch control circuitry 412 activates the latch control lines and when all the latches 320, 322, 324 have finished latching the input data. In step 808, a determination is made as to whether the information on one or several of the address and/or command lines transitioned to a new value during the finite response time, creating an error condition. This determination may be made by the command decoder 302 and communicated to the latch control circuitry 412. Alternatively, the latch control circuitry 412 may be configured to independently detect the transition.

In one embodiment, if only some of the information on the address and command lines transitioned before the latches 320, 322, 324 engaged, an incorrect command and/or address may be stored in the latches 320, 322, 324. Accordingly, when the latches are disengaged, the incorrect command and/or address information may be passed to the command decoder 302, possibly resulting in incorrect access to the memory bank 314 and data loss. However, if no transition (or a complete transition) of information on the control and/or address lines occurred, no error condition is present and the process 800 may proceed to step 820, where the external access to the dynamic memory device 300 may be suspended.

In one embodiment, if a partial transition is detected in step 808, the process 800 may proceed to step 810, where the latch control circuitry 412 may deactivate the one or more latch control lines that control the address and command latches 320, 322. In step 812 and 814, the address and command latches 320, 322 may disengage, and the information transition on the address and control lines may complete.

In one embodiment, when the latch control circuitry 412 detects that the transition has completed, the latch control circuitry 412 may re-activate the one or more latch control lines that control the address and command latches 320, 322 in step 816. Consequently, the address and command latches 320, 322 may re-engage in step 818, and the process 800 may return to step 808.

Figure 9:
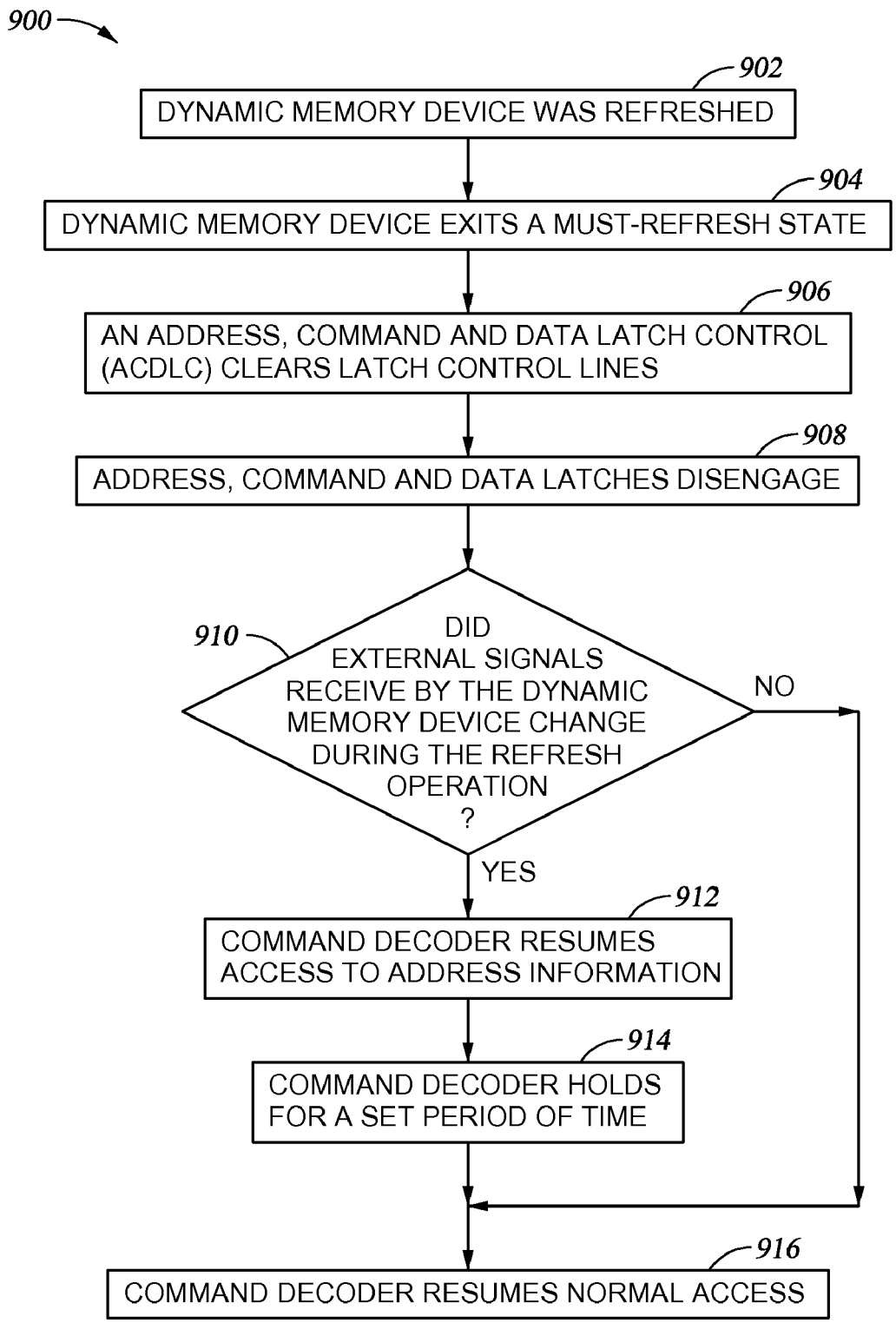
FIG. 9 is a flow chart depicting a process for resuming access to the dynamic memory device, according to one embodiment of the invention.

FIG. 9 is a flow chart depicting a process 900 (corresponding to step 722 of FIG. 7) for resuming access to the dynamic memory device 300, according to one embodiment of the invention. The process 900 may begin at step 902, where the dynamic memory device 300 may have been refreshed. The process 900 may proceed to step 904, where the dynamic memory device 300 may exit the must-refresh state. Depending on the specific implementation of the invention, this may occur when the refresh request counter 404, the arbiter 406, or other circuitry appropriately configured receives an indication from the state machine 410 that the refresh operation has completed. An address, command and data latch control then clears the latch control lines at step 906.

In one embodiment an activate-request (generated by the circuit controlling the must-refresh execution) may be sent to the arbiter 206 prior to completion of the refresh. Once the refresh has ended this activate-request is prioritized by the arbiter and the device is reactivated according to the address, command, and data-vectors stored in the corresponding command latches 320, address latches 322 and data latches 324. This ensures that the command interrupted by the must-refresh is resumed. After the reactivation occurs, the command latches 320, the address latches 322, and the data latches 324 may disengage at step 908, allowing the stored data access to the command decoder 302.

In one embodiment the disengagement of the different latches may be timed by a sequencer allowing different latches to be disengaged at different times in order to satisfy setup and hold-time conditions of the state-machine 210 and the elements 110, 112, 116, and 118. In one embodiment the data-latches may be disengaged after a write-back period (tWR) after the command and address-latches are disengaged. This sequencer ensures that asynchronous sequences which are guaranteed by a performance specification in normal operating mode (without latches restricting the input-vectors) are also fulfilled during must-refresh operation with latches engaged.

Once the latches disengage, the address-buffer 308, the address transition detection circuit 306 and the command decoder 302 may detect changes of the input-signals and execute commands accordingly (transition from the previously re-activated to the new command). If the external signals remained the same, the command decoder 302 may continue the reactivated operation, as in step 916. However, a potential timing error exists if the external signals changed while the dynamic memory device 300 was in the must-refresh state. Signals which arrive sequentially may be interpreted by the command decoder 302 as arriving simultaneously. For example, on a dynamic memory device 300 that was performing a read operation prior to entering the must-refresh state, data may be lost if, while in the must-refresh state, the dynamic memory device 300 receives an address update (for the read operation) followed by a command change from read to write. When the must-refresh state ends and access is renewed, the new address and command information may reach the command decoder 302 simultaneously, and a late-write may be performed on the data in the original address, rather than writing to the updated address. To circumvent this potential error, the command decoder 302 may be configured to assign a priority to each updated input and thereby insert delays to re-create the sequential nature of the inputs.

In one embodiment, if the command decoder 302 detects that the address and/or command data changed while in the must-refresh state in step 910, the process 900 may proceed to 912. In step 912 and 914, the command decoder 302 may allow address information to propagate through to the memory bank 314 and may then hold for a predetermined period of time. The command decoder 302 may then resume normal operation, allowing command data to propagate through to the memory bank 314, as in step 916. If the command decoder 302 detects that the address and/or command data did not change while in the must-refresh state in step 910, the process 900 may proceed to 916 directly. Although described with respect to address and command inputs, other inputs into the command decoder 302 may exist (e.g., chip-select) and other priority schemes may be equally applicable. The preceding example is for illustrative purposes and should not be considered limiting of the invention.

Figure 10A:
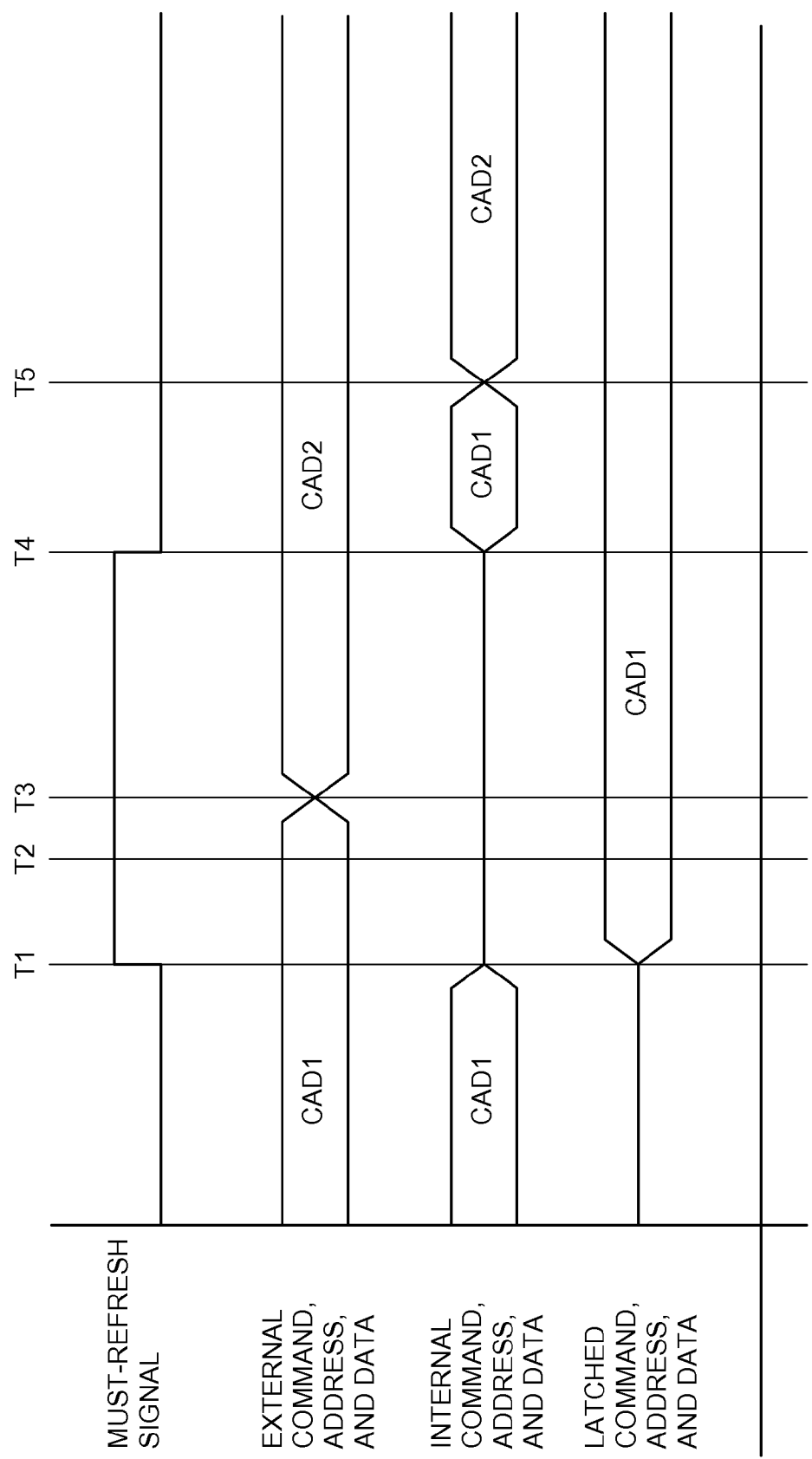
FIGS. 10A-B are timing diagrams depicting must-refresh operations according to one embodiment of the invention.

FIG. 10A is a timing diagram depicting the latching of command, address, and data information by the memory device 300 during a must-refresh period according to one embodiment of the invention. Initially (before time t1), a first set of command, address, and data (CAD1) is externally applied to the memory device 300 by a memory controller or processor. As depicted, the externally presented command, address, and data are also presented internally within the memory device 300 as CAD1 (e.g., the external CAD1 is presented internally to the command decoder 302, control circuit 304, address buffer 308, and internal read/write data lines of the memory device 300 without further buffering).

At time t1, a must-refresh signal is received within the memory device 300. Upon receiving the must-refresh signal, the state of the memory device 300 is saved by latching the external command, address and data CAD1. After the external command, address, and data CAD1 is latched, the memory device 300 is placed in a standby state from time t1 to t4 during which the external command, address, and data information is buffered from the internal control circuitry of the memory device 300. While the memory device 300 is in the standby state, the must-refresh is performed.

In some cases, the external command, address, and data may be changing as the memory device 300 receives the must-refresh signal. In order to ensure that the correct external command, address, and data is latched by the memory device 300, the memory device 300 may have a listening period from times t1 to t2 during which the external command, address, and data is monitored for changes. If the external command, address, and data changes during the listening period, then the changed external command, address, and data may be latched by the memory device 300. The listening period thereby ensures that the correct set of external command, address, and data is latched by the memory device 300 without a race condition developing.

If the external command, address, and data changes during the standby state, the external change is buffered from the internal command decoder 302, control circuit 304, address buffer 308, and read/write data lines of the memory device 300. Thus, at time t3, the first set of external command, address, and data CAD1 may transition to a second set of external command, address, and data CAD2. As depicted, the external change to CAD2 does not affect the internal standby state of the memory device 300 nor does the external change modify the set of latched command, address, and data CAD1.

By buffering the external command, address, and data changes from the internal circuitry of the memory device 300, the must-refresh command may be completed and the previous state of the memory device 300 may be restored, thereby allowing the memory device 300 to return to the previous state before continuing the processing of the external command, address, and data. Thus, when the must-refresh command completes at time t4, the memory device 300 is taken out of the standby state and the previous state of the memory device 300 at time t1 is restored by providing the latched command, address, and data CAD1 to the internal circuitry of the memory device 300 (e.g., the latched command, address, and data CAD1 is provided to the command decoder 302, control circuit 304, address buffer 308, and internal read/write data lines of the memory device 300).

After the previous state of the memory device 300 is restored at time t4, the memory device 300 may resume processing the external command, address, and data CAD2 at time t5. Thus, at time t5, the external command, address, and data CAD2 is provided to the command decoder 302, control circuit 304, address buffer 308, and internal read/write data lines of the memory device 300. The memory device 300 may then begin processing the second set of command, address, and data, having successfully entered into the standby state, performed the must-refresh, and restored the previous state. As previously described, latching of the external command, address, and data during performance of the must-refresh command allows the memory device 300 to suspend processing of a read command, write command, or other command and to subsequently resume processing after the internal must-refresh command has been performed.

Figure 10B:
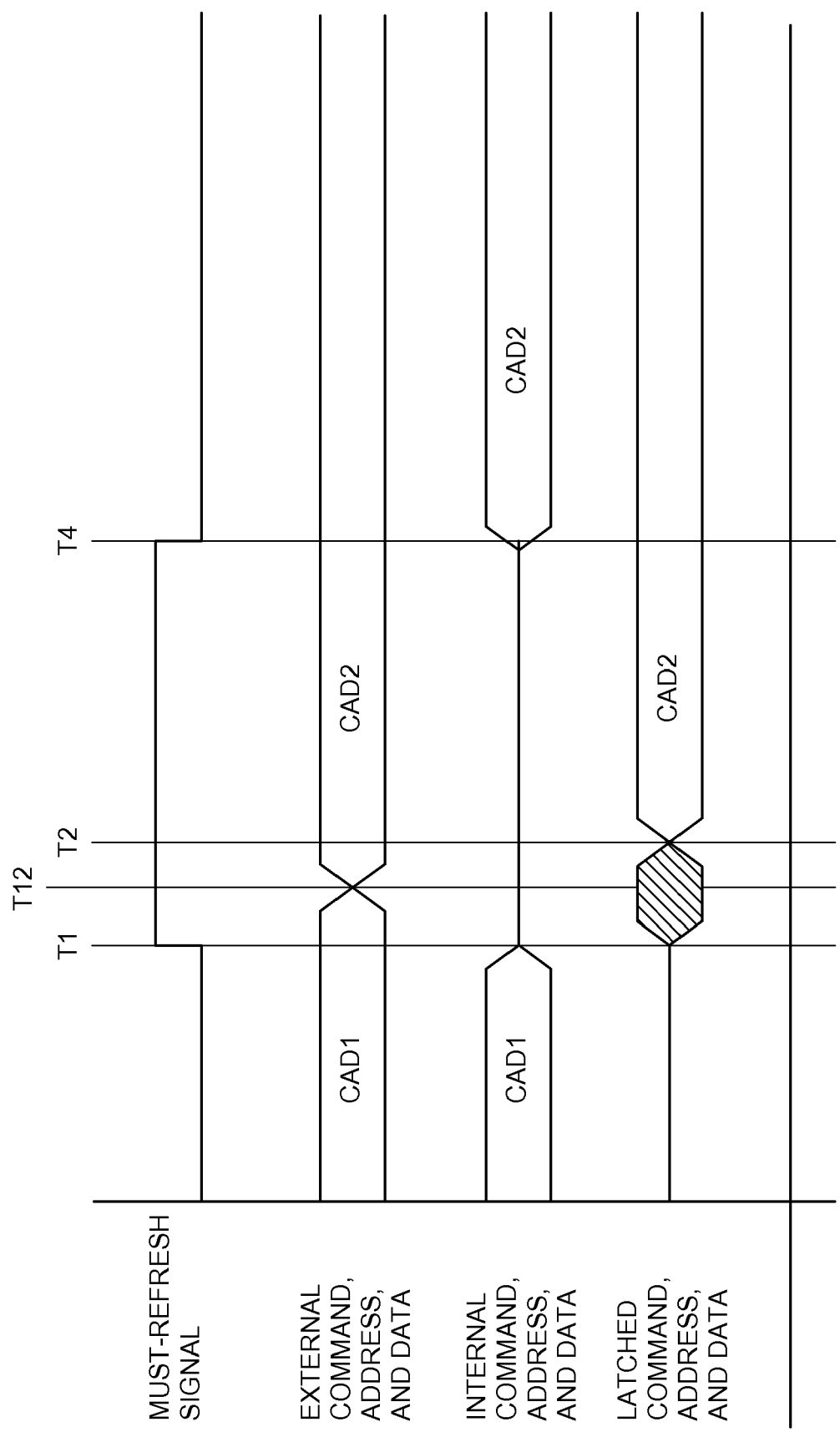

FIG. 10B is a timing diagram depicting another example of the latching of command, address, and data information by the memory device 300 during the must-refresh period according to one embodiment of the invention. FIG. 10B depicts a situation in which the external command, address, and data changes during the listening period from times t1 to t2. As depicted, at time t12, the external command, address, and data changes from CAD1 to CAD2. Because the change in command, address, and data occurs during the listening period (indicating that the previous state has been completed and the memory device 300 is now in a new state), the new command, address, and data CAD2 is latched by the memory device 300. Then, at time t4, when the memory device 300 has completed the internal must-refresh command and is taken out of the standby state, the previously latched command, address, and data CAD2 is provided internally to the memory device 300, thereby allowing the memory device 300 to resume processing the external command, address, and data in the appropriate state.

CONCLUSION

Advantageously, embodiments of the present invention provide methods and systems for refreshing the stored contents of a memory module. This refreshing may occur during normal access to the memory module, as well as during low-frequency access, and may permit the use of a full command-set during low-frequency operation.

While the foregoing is directed to embodiments of the present invention, other and further embodiments of the invention may be devised without departing from the basic scope thereof, and the scope thereof is determined by the claims that follow.

What is claimed is:

1. A method of operating a system including a memory device, comprising:
    upon receiving a request for an internal hidden refresh for the memory device:
        latching external command, address, and data information for the memory device;
        placing the memory device in a standby state;
        during the standby state, performing the internal hidden refresh;
        after performing the internal hidden refresh, placing the memory device in a state corresponding to the latched external command, address, and data information for the memory device; and
        upon determining that the external command, address, and data information has changed after the received request for the internal hidden refresh, latching the changed external command, address, and data information.

2. The method of claim 1, wherein the state corresponding to the latched external command is a write state.

3. The method of claim 1, wherein placing the memory device in the state corresponding to the latched external command, address, and data information comprises providing the latched external command to a command decoder for the memory device.

4. The method of claim 1, wherein placing the memory device in the state corresponding to the latched external command, address, and data information comprises providing the latched external address to an address buffer for the memory device.

5. The method of claim 1, wherein placing the memory device in the state corresponding to the latched external command, address, and data information comprises providing the latched data to read/write data lines for the memory device.

6. A method of operating a system including a memory device, comprising:
    upon receiving a request for an internal hidden refresh for the memory device:
        latching external command, address, and data information for the memory device;
        placing the memory device in a standby state;
        during the standby state, performing the internal hidden refresh;
        after performing the internal hidden refresh, placing the memory device in a state corresponding to the latched external command, address, and data information for the memory device; and
        upon determining that the external command, address, and data information has changed within a predefined listening period beginning from the received request for the internal hidden refresh, latching the changed external command, address, and data information.

7. A memory device comprising:
    circuitry configured to, upon receiving a request for an internal hidden refresh for the memory device:
        latch external command, address, and data information for the memory device;
        place the memory device in a standby state;
        during the standby state, perform the internal hidden refresh;
        after performing the internal hidden refresh, place the memory device in a state corresponding to the latched external command, address, and data information for the memory device; and
        upon determining that the external command, address, and data information has changed after the received request for the internal hidden refresh, latch the changed external command, address, and data information.

8. The memory device of claim 7, wherein the state corresponding to the latched external command is a write state.

9. The memory device of claim 7, wherein placing the memory device in the state corresponding to the latched external command, address, and data information comprises providing the latched external command to a command decoder for the memory device.

10. The memory device of claim 7, wherein placing the memory device in the state corresponding to the latched external command, address, and data information comprises providing the latched external address to an address buffer for the memory device.

11. The memory device of claim 7, wherein placing the memory device in the state corresponding to the latched external command, address, and data information comprises providing the latched data to read/write data lines for the memory device.

12. A memory device comprising:
    circuitry configured to, upon receiving a request for an internal hidden refresh for the memory device:
        latch external command, address, and data information for the memory device;
        place the memory device in a standby state;
        during the standby state, perform the internal hidden refresh;
        after performing the internal hidden refresh, place the memory device in a state corresponding to the latched external command, address, and data information for the memory device; and
        upon determining that the external command, address, and data information has changed within a predefined listening period beginning from the received request for the internal hidden refresh, latch the changed external command, address, and data information.

13. A method for operating a system including a memory device, comprising:
    determining an external selection time for the memory device;

upon determining that the external selection time for the memory device is less than a predetermined selection time, providing a first minimum selection time for the memory device, wherein at least one internal hidden refresh is performed during the first minimum selection time;

upon determining that the external selection time for the memory device is greater than or equal to the predetermined selection time, providing a second minimum selection time for the memory device, wherein at least a first and a second internal hidden refresh are performed during the second minimum selection time and wherein the second minimum selection time is greater than the first minimum selection time;

during the second minimum selection time and upon receiving a request for the second internal hidden refresh:
  latching external command, address, and data information for the memory device;
  placing the memory device in a standby state;
  during the standby state, performing the second internal hidden refresh; and
  after performing the second internal hidden refresh, placing the memory device in a state corresponding to the latched external command, address, and data information for the memory device.

14. The method of claim 13, further comprising:
after latching the external command, address, and data information, determining whether the external command, address, and data information has changed;
upon determining that the external command, address, and data information has changed, latching the changed external command, address, and data information; and
placing the memory device in a state corresponding to the changed external command, address, and data information.

15. The method of claim 13, wherein the second minimum selection time is maintained by the memory device only when the memory device is placed in a low-frequency mode.

16. The method of claim 13, wherein each internal hidden refresh is performed in response to an internal timer of the memory device, and wherein an address for each internal hidden refresh is provided by an internal address counter of the memory device.

17. The method of claim 13, wherein both read and write accesses are allowed during the first minimum selection time and the second minimum selection time.

18. The method of claim 13, wherein the external selection time for the memory device is measured beginning at a first transition of a chip select signal.

19. The method of claim 13, wherein external access to the memory module is restricted while the second internal hidden refresh is performed.

20. A memory device, comprising:
circuitry configured to:
  determine an external selection time for the memory device;
  upon determining that the external selection time for the memory device is less than a predetermined selection time, provide a first minimum selection time for the memory device, wherein at least one internal hidden refresh is performed during the first minimum selection time;
  upon determining that the external selection time for the memory device is greater than or equal to the predetermined selection time, provide a second minimum selection time for the memory device, wherein at least a first and a second internal hidden refresh are performed during the second minimum selection time and wherein the second minimum selection time is greater than the first minimum selection time;
  during the second minimum selection time and upon receiving a request for the second internal hidden refresh:
    latch external command, address, and data information for the memory device;
    place the memory device in a standby state;
    during the standby state, perform the second internal hidden refresh; and
    after performing the second internal hidden refresh, place the memory device in a state corresponding to the latched external command, address, and data information for the memory device.

21. The memory device of claim 20, further comprising:
after latching the external command, address, and data information, determining whether the external command, address, and data information has changed;
upon determining that the external command, address, and data information has changed, latching the changed external command, address, and data information; and
placing the memory device in a state corresponding to the changed external command, address, and data information.

22. The method of claim 13, wherein the second minimum selection time is maintained by the memory device only when the memory device is placed in a low-frequency mode.

23. The method of claim 13, wherein each internal hidden refresh is performed in response to an internal timer of the memory device, and wherein an address for each internal hidden refresh is provided by an internal address counter of the memory device.

24. The memory device of claim 20, wherein both read and write accesses are allowed during the first minimum selection time and the second minimum selection time.

25. The memory device of claim 20, wherein the external selection time for the memory device is measured beginning at a first transition of a chip select signal.

26. The memory device of claim 20, wherein external access to the memory module is restricted while the second internal hidden refresh is performed.

27. A system, comprising:
a memory controller; and
a memory device configured to:
  determine an external selection time for the memory device, wherein the memory controller selects the memory device during the external selection time;
  upon determining that the external selection time for the memory device is less than a predetermined selection time, provide a first minimum selection time for the memory device, wherein at least one internal hidden refresh is performed during the first minimum selection time and wherein the memory controller maintains the memory device in a selected state for the first minimum selection time;
  upon determining that the external selection time for the memory device is greater than or equal to the predetermined selection time, provide a second minimum selection time for the memory device, wherein at least a first and a second internal hidden refresh are performed during the second minimum selection time, wherein the memory controller maintains the memory device in a selected state for the second minimum selection time, and wherein the second minimum selection time is greater than the first minimum selection time;

during the second minimum selection time and upon receiving a request for the second internal hidden refresh:
- latch external command, address, and data information for the memory device;
- place the memory device in a standby state;
- during the standby state, perform the second internal hidden refresh; and
- after performing the second internal hidden refresh, place the memory device in a state corresponding to the latched external command, address, and data information for the memory device.

28. The system of claim 27, further comprising:
after latching the external command, address, and data information, determining whether the external command, address, and data information has changed;
upon determining that the external command, address, and data information has changed, latching the changed external command, address, and data information; and
placing the memory device in a state corresponding to the changed external command, address, and data information.

29. The system of claim 27, wherein the second minimum selection time is maintained by the memory device only when the memory device is placed in a low-frequency mode.

30. The system of claim 27, wherein each internal hidden refresh is performed in response to an internal timer of the memory device, and wherein an address for each internal hidden refresh is provided by an internal address counter of the memory device.

31. The system of claim 27, wherein both read and write accesses are allowed during the first minimum selection time and the second minimum selection time.

32. The system of claim 27, wherein the external selection time for the memory device is measured beginning at a first transition of a chip select signal.

33. The system of claim 27, wherein external access to the memory module is restricted while the second internal hidden refresh is performed.

* * * * *